ELECTRONICALLY ADJUSTABLE NANOSECOND PULSE
GENERATOR UTILIZING STORAGE DIODES
HAVING SNAP-OFF CHARACTERISTICS

Filed Dec. 26, 1962

INVENTORS:
WILLIAM PEIL,
DAVID L. BERRY, DECEASED,
BY LOMOND I. BERRY
AND MARY W. BERRY, ADMINISTRATORS
BY Richard V. Lang
THEIR ATTORNEY United States Patent Office 3,205,375

Patented Sept. 7, 1965

3,205,375

ELECTRONICALLY ADJUSTABLE NANOSECOND PULSE GENERATOR UTILIZING STORAGE DIODES HAVING SNAP-OFF CHARACTERISTICS

David L. Berry, deceased, late of Lincoln, N.Y., by Lomond I. Berry and Mary W. Berry, administrators, Lincoln, and William Peil, Clay, N.Y., assignors to General Electric Company, a corporation of New York Filed Dec. 26, 1962, Ser. No. 247,395
14 Claims. (Cl. 307—88.5)

This invention relates to apparatus for generating electric pulses of short duration and, in particular, to pulse generating appartus permitting electronic variation in the width and polarity of the pulses produced thereby. The invention is related to the invention disclosed in application S.N. 247,396 concurrently filed on behalf of the present inventors, and entitled "Variable Width Pulse Generator."

In many electronic applications it is desirable to have a pulse generator capable of producing pulses at a repetition rate on the order of forty megacycles per second or more, the generator permitting variation of pulse width in the fractional and lower integral nanosecond (1/1,000-000,000 second) range. Prior art pulse generators have permitted mechanical variation in pulse width and enabled generation of nanosecond pulses. None of the prior art pulse generators known, are capable of generation of electronically variable width nanosecond pulses at a repetition rate of forty megacycles or more. The present invention overcomes the prior art limitations on pulse generation.

It is an object of the invention to provide an improved pulse generator.

It is an object of the invention to provide an improved pulse generator permitting electronic variation in pulse width.

It is another object of the invention to provide a generator for supplying pulses having widths in the fractional and lower integral nanosecond range.

It is another object of the invention to provide apparatus for pulse generation permitting electronic variation of pulse polarity in the fractional and lower integral nanosecond range.

It is a further object of the invention to provide an electronically variable width nanosecond pulse generator capable of peak power levels as high as several hundred watts.

Briefly stated, in accordance with the illustrated embodiments of the invention, pulse generation is effected in a circuit configuration utilizing storage diodes having "snap-off" characteristics. The pulse generator includes a source of periodic waves of radio frequency coupled to two parallel channels in each of which a storage diode is provided. In one of these channels, the storage diode is connected in shunt with a signal path and so poled that positive going portions of signals are attenuated by the presence of the low impedance shunting effect of the diode while negative going portions of the signal are initially attenuated, and then abruptly passed as the diode becomes non-conductive. In the second channel, to which waves of instantaneously opposing polarity are applied, the storage diode is inversely poled so that applied negative going signals are attenuated while positive going signals are initially attenuated and then abruptly passed as the diode snaps off. The outputs of the two channels are recombined at the output terminal of the generator. When the channels are properly balanced in phase and amplitude, wave fronts are generated due to relatively different times of snap-off of said diodes to form the desired output pulse, whose width is determined by the relatively different times of snap-off. Means are further provided in the network, typically by arranging suitable delay in the paths interconnecting the respective diodes, to prevent interaction between them while the output pulse is being formed. The duration of the output pulse may be electronically adjusted by the bias applied to the respective diodes.

In accordance with another embodiment of the invention, the storage diodes are connected in series in the respective channels. In order to improve the signal-to-noise ratio, means are further provided to clip signals below a certain arbitrary level.

The subject matter of the invention is particularly pointed out and distinctly claimed in the concluding portion of the specification. The invention, however, may best be understood by reference to the following description taken in connection with the accompanying drawings, in which:

Figure 1:
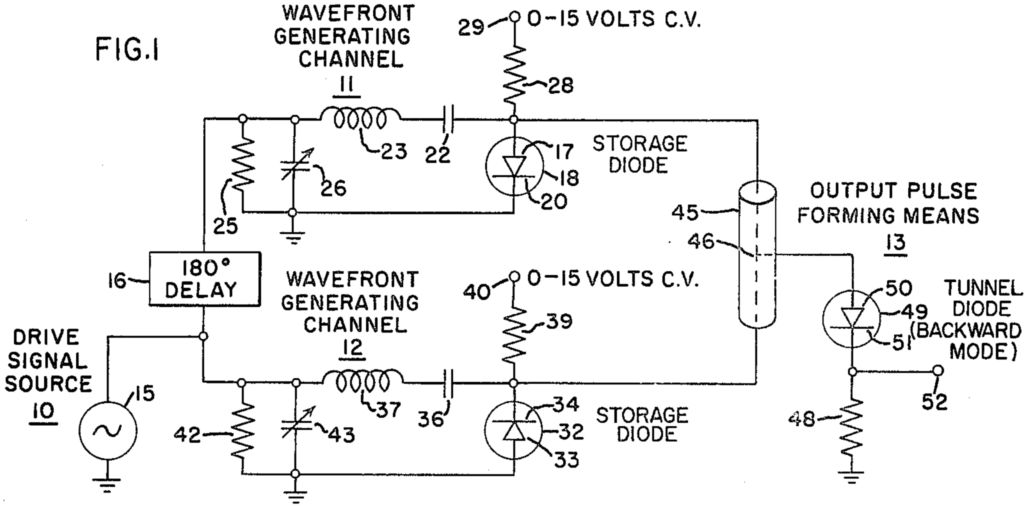
FIG. 1 is a circuit diagram illustrating one embodiment of the variable width nanosecond pulse generator of the invention utilizing shunt connected storage diodes.

With reference to FIG. 1, the embodiment of the invention illustrated therein, considered as a whole, comprises a drive signal source 10, a pair of wavefront generating channels 11 and 12 connected to source 10 each including a storage diode mutually oppositely poled, and an output pulse forming means 13 connected to the wavefront generating channels 11 and 12. Signal source 10 provides a drive signal of radio frequency for simultaneous application to wavefront generating channels 11 and 12. Channels 11 and 12 operate upon the applied drive signal to produce wavefronts for application to output pulse forming means 13, control means being provided in at least one of the channels to vary the time interval between the generated wavefronts in the respective channels. Output pulse forming means 13 receives the wavefronts generated in channels 11 and 12 and produces a voltage pulse output having a width equal to the time interval between the pair of wavefronts applied thereto.

The drive signal source 10 may comprise a sine wave generator 15, as shown, having a frequency corresponding to the desired pulse output repetition rate, e.g., fifty megacycles per second. The sine wave output of generator 15 is applied in parallel to wavefront generating channels 11 and 12 through appropriate transmission lines, the signal applied to channel 11 being delayed approximately 180° or one-half cycle of generator 15 by means of phase-shift network 16. A sine wave generator with push-pull outputs may be utilized as an alternative to phase-shift network 16.

Wavefront generating channel 11, which produces a negative wavefront, comprises a storage diode 18 having an anode electrode 17 and a cathode electrode 20. Anode electrode 17 of storage diode 18 is connected to phase-shift network 16 through the serial combination of capacitor 22 and inductor 23, the latter two components forming a filter which allows the drive signal from generator 15 to pass to storage diode 18 but blocks the high frequency components in the wavefront generated by storage diode 18. Anode 17 of storage diode 18 is also connected through resistor 28 to terminal 29, a variable D.C. voltage source being connected to terminal 29 to adjust the bias on storage diode 18. Cathode electrode 20 of storage diode 18 is connected to ground. Resistor 25, connected between a terminal of inductor 23 and ground, has a value selected to make the impedance of the transmission line from phase-shift network 16 equal to its characteristic impedance and thus serves to terminate the transmission line. Variable capacitor 26, connected across resistor 25, serves to tune out or cancel the net inductance of wavefront generating channel 11 as seen from generator 15 to achieve a more nearly resistive termination.

Wavefront generating channel 12, which produces a positive wavefront, similarly comprises a storage diode 32 having an anode electrode 33 and a cathode electrode 34. Cathode electrode 34 of storage diode 32 is connected to generator 15 through capacitor 36 and inductor 37. The latter circuit elements comprise a filter which prevents the high frequency components in the wavefront generated by diode 32 from reaching generator 15, while permitting transmission of the sine wave signal from generator 15 to storage diode 32. Cathode electrode 34 of storage diode 32 is also connected through resister 39 to terminal 40, a variable D.C. voltage source being connected to terminal 40 to adjust the bias on storage diode 32. Anode electrode 33 of storage diode 32 is connected to ground. Resistor 42, connected between a terminal of inductor 37 and ground has a value selected to make the impedance of the transmission line from generator 15 equal to its characteristic impedance and thus serves to terminate the transmission line. Variable capacitor 43, connected across resistor 42, serves to tune out or cancel the net inductance of wavefront generating channel 12 as seen from generator 15 to achieve a more nearly resistive termination.

Output pulse forming means 13 comprises a delay line 45, which may be a length of transmission line. One end of delay line 45 is connected to anode electrode 17 of storage diode 18 in wavefront generating channel 11, while the other end of delay line 45 is connected to cathode electrode 34 of storage diode 32 in wavefront generating channel 12. A tap at an intermediate point 46 of delay line 45 is connected to a terminal of load resistor 48 through tunnel diode 49 having anode electrode 50 and cathode electrode 51. Anode electrode 50 of tunnel diode 49 is connected to the tap point 46 while cathode electrode 51 is connected to a terminal of resistor 48, the other terminal of load resistor 48 being connected to ground. An output terminal 52 is connected to the common connection of resistor 48 and cathode electrode 51 of tunnel diode 49 for deriving the generated output pulse.

In accordance with the invention, storage diodes 18 and 32 in wavefront generating channels 11 and 12 respectively provide wavefronts which control the formation and the width of the output pulse. A storage diode is a semiconductor PN junction device which exhibits charge storage or capacitive effects when the diode is biased in the reverse direction, having been previously biased in the forward direction. This charge storage effect produces a transient phenomenon in that when the forward bias terminates and the reverse bias is applied, that the diode continues to exhibit a low impedance. After the stored charges are removed, the impedance increases abruptly, causing an abrupt cessation of reverse current flow.

The charge storage effect results from the temporary storage of minority carriers which are injected into the P and N regions of the diode during the period when the diode is biased in the forward direction, i.e., holes flow into the N region and electrons flow into the P region of the diode. Upon application of a reverse bias current to the storage diode, the diode initially presents a very low impedance to the reverse voltage as the reverse current occurs due to the return flow of the previously injected minority carriers. Instantly upon removal of the injected carriers, the diode abruptly assumes its normal high reverse impedance state. This abrupt change in conductivity is utilized in the pulse generator of the invention. The number of injected minority carriers and hence the duration of the transient current upon application of a reverse bias is in part a function of the total forward bias applied to the storage diode. For a more complete discussion of the semiconductor physics involved in this storage effect, reference is made to an article by Robert H. Kingston entitled "Switching Time in Junction Diodes and Junction Transistors" appearing at pp. 829–834 of volume 42 of the Proceedings of the Institute of Radio Engineers for May 1954; or to an article by J. L. Moll entitled "P-N Junction Charge-Storage Diodes" appearing at pp. 43–53 of volume 50 of the Proceedings of the Institute of Radio Engineers for January 1962.

Parametric diodes and snap-off diodes represent types of storage diodes now available. The latter type is distinguished from the former by the existence therein of a physically more abrupt junction between the P and N type materials which produces a wavefront having a rapid rise time. Storage diodes 18 and 32 in the embodiment illustrated in FIG. 1 may be either snap-off diodes or parametric diodes, having the snap-off property.

The storage diodes currently available operate with sinusoidal signal sources lying in the range of 40–200 megacycles. It should be apparent, however, that the frequency spectrum may be extended substantially in both directions dependent upon the characteristics of the available diodes. The snap-off characteristic of a storage diode has been described as having a relatively long storage phase, during which the impedance of the diode is very small followed by a decay phase in which the impedance climbs abruptly to a very high value. The storage phase of these diodes lasts for a time comparable to the lifetime of the residual stored carriers created during the conduction period, while the time for the decay may be several orders of magnitude less than the carrier lifetime. For maximum power generation, an optimum relationship occurs when the time integral of the current from current reversal to one quarter cycle later of the applied waves is approximately equal to the total charge stored in the diode at time of current reversal. This may be expressed as follows:

$$q_{\text{diode}(0)}=\int_{t=0}^{t=\frac{1}{4}f_0} i(t)\,dt$$

where $q$ diode $_{(0)}$ is the charge stored in the diode to prior injection at the instant ($t_0$) of current reversal,
$f_0$ is the repetition frequency of the periodic source, and
$i_{(t)}$ is the reverse current flowing in the diode.

It can thus be seen that a direct relationship exists between the charge capable of being injected into the diode and the frequency of the source for which maximum snap-off current—and hence maximum pulse power—is generated.

If one uses too low a frequency, it should be qualitatively apparent that "snap-off" switching will occur at too low a value on the output current waveform to achieve efficient operation. At the other end of the frequency spectrum, one reaches a point at which the frequency is so great that the stored carrier lifetimes are greater than the time required for the applied current to reverse. In that event charges will be perpetually available and snap-off action will never occur, or may occur under the influence of parametric sub-harmonic degeneration. Operation in this latter region is to be avoided.

Figure 2:
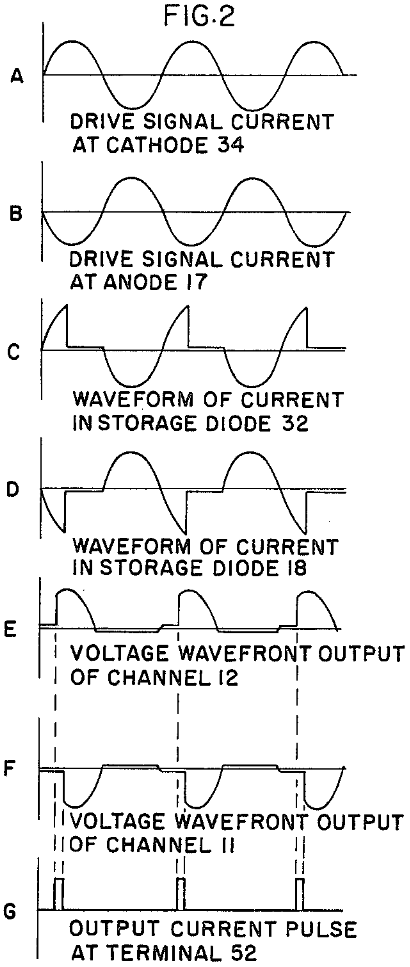
FIGS. 2A–2G illustrate the waveforms present during operation of the circuit of FIG. 1 and the output pulses produced thereby.

Considering now the operation of the circuit of FIG. 1 as a whole and referring to the waveforms illustrated in FIG. 2, the sine wave output signal of generator 15, which serves as the circuit drive signal, is illustrated in FIG. 2A. This signal is applied to cathode electrode 34 of storage diode 32. FIG. 2B illustrates the 180° delayed drive signal which is applied to anode electrode 17 of storage diode 18. FIG. 2C illustrates the waveform of the current flow through storage diode 32 in response to the drive signal of FIG. 2A. Current flows through diode 32 during the entire half cycle during which diode 32 is forward biased and during the initial portion of the half cycle during which diode 32 is reverse biased, the latter current being due to the stored minority carriers injected during the forward bias half cycle. The storage diode thus exhibits a low impedance during the initial portion of the reverse bias half cycle when the reverse current is flowing and the impedance across the diode terminals is low. When the return flow of the previously injected minority carriers ceases, the impedance of the diode increases abruptly, almost the entire drive voltage then appearing across the diode terminals to produce a wavefront, as illustrated in FIG. 2E. The corresponding current and voltage waveforms for storage diode 18 are illustrated in FIGS. 2D and 2F respectively.

As previously described, the number of minority carriers injected during the forward bias portion of the applied drive signal is a function in part of the magnitude of the total forward bias on the diode. In the embodiment of the invention illustrated in FIG. 1, the total forward bias on storage diode 18 and 32 may be conveniently controlled by the application of appropriate control potentials to terminals 29 and 40 respectively. Thus, the duration of the reverse current pulses during the reverse bias half cycle and the point in the reverse bias half cycle at which the abrupt positive and negative wavefronts of voltage occur across storage diodes 32 and 18, as shown in FIGS. 2E and 2F respectively, may be varied to produce a time interval between the aforementioned wavefronts generated in the respective channels. Control could also be exercised by phase-shift techniques utilized in conjunction with the drive signals.

The wavefronts generated in channels 11 and 12 are applied to opposite ends of delay line 45, the wavefronts traveling through the delay line toward tap point 46. If the wavefronts have been generated at the same time in the reverse bias half cycle of the drive signal and assuming equal time delays, they will arrive at tap point 46 at the same time and will cancel each other, no net voltage being applied to load resistor 48 and hence no output pulse appearing at terminal 52. If the biases on diodes 32 and 18 are adjusted so that the positive wavefront generated in channel 12 occurs earlier than the negative wavefront generated in channel 11, as shown in FIGS. 2E and 2F, the positive wavefront from channel 12 will reach tap point 46 before the negative wavefront from channel 11. A net positive pulse shown in FIG. 2G is then applied to load resistor 48 for a period equal to the time interval which elapses before the negative wavefront from channel 11 arrives through delay line 45 to tap point 46. Thus, the output pulse appearing at terminal 52 has a width equal to this time interval which may be varied by adjusting the control bias on the storage diodes, as previously described. If the control biases on the storage diodes are electronically adjusted so that the negative wavefront in channel 11 occurs after the positive wavefront in channel 12, a positive pulse will appear at output terminal 52.

The arrangement thus synthesizes a pulse from two wavefronts of equal amplitudes and opposing polarity launched down separate channels to a common output terminal. The onset of the output pulse, assuming both snap-off diodes are initially conducting and blocking the transmission of energy from the input source to the output terminal, occurs when one diode snaps off. The rapidity of the snap-off is due to the abrupt increase in impedance of the diode as the last of the stored charge carriers are removed, and it creates the abrupt wavefront propagating toward the output terminal in the first channel. The termination of the output pulse occurs when the other snap-off diode abruptly goes non-conductive, permitting the propagation of energy in the form of a second wavefront of opposing polarity toward the output terminal in the other channel. If the respective channels are balanced so that at output terminals the wavefronts have initial plateaus of equal and opposite instantaneous amplitudes, the arrival of the second wavefront at the output terminal terminates the pulse.

It may thus be seen that for satisfactory termination of the output pulse that balance should be achieved between the respective channels at the output terminal. While balancing may be readily achieved in a number of ways, one may conveniently have the waves from the input source arrive in substantial phase opposition and amplitude coincidence at the respective snap-off diodes. One may at the same time arrange equal path lengths from the respective snap-off diodes to the common output terminals. Assuming balance between the channels, the output noise between pulses, occurring when both diodes are conductive, is also greately attenuated.

As illustrated in the drawing, the biases applied to the diodes 18 and 32 are supplied by variable control voltage sources having a range of 0–15 volts during a resistance of 360 ohms. This tends to establish a current, absent any signal from the source 10, in the range of from 10–50 milliamperes. When a signal is present, by natural rectification a considerably larger self-rectified current may be present. Accordingly, the control bias adjustment is arranged to provide merely a small shift of the average current level and thereby provide adjustment of the moment of snap-off within the cycle. If one wishes to maintain the center of the pulse constant in time, one may conveniently do this by increasing the bias applied to the diode 18 while decreasing by an equal amount the bias supplied to the diode 32. In a practical case the external bias may in both cases be of the same polarity as illustrated in FIG. 1.

The delay line 45 should have adequate total delay in the path between storage diodes to prevent interaction between the devices during pulse formation. This may most simply be arranged by using a standard transmission line having sufficient extra length (approximately ⅔ foot per nanosecond) to provide a delay greater than the greatest duration pulse. It may be seen that the effect of interaction may be to prevent the snap-off of the later operating diode by injecting additional carriers.

While delay means may be used for achieving isolation, one may also introduce a small series resistance in the output leads of the respective diodes. This large series resistance tends to reduce the cross-coupling of energy into the diode still in the low resistance condition, and does not deteriorate the wavefront being formed at the instant of snap off. In certain cases both a delay line and a small series resistance may be employed, since the resistance is particularly effective in damping unwanted reflections.

Reference numeral 49 identifies a tunnel diode, operated in the back diode mode, serially connected with load resistor 48. A tunnel diode is a semiconductor device having a single P-N junction and characterized by a suitably high operating speed capability. The P and N materials are rendered highly conductive by increasing the concentration of acceptor and donor impurities, the high conductivities of the P and N materials resulting in an extremely thin barrier or space charge depletion region which permits electrons to traverse the barrier by means of a mechanism called quantum mechanical tunneling. The tunneling phenomenon gives rise to a region of negative resistance in the diode characteristics, the negative resistance region terminating in a valley prior to entering the positive resistance region of normal diode operation. In the back part of its characteristics, the tunnel diode exhibits low impedance, a large increase in tunneling current occurring for a small incremental increase in voltage. Resulting current may be many hundreds of times higher than the current resulting from the same magnitude of voltage applied in the forward part of the characteristics (known as the valley region). When connected to take advantage of the back part of its characteristics, the tunnel diode is said to be operating in its "back" diode mode.

Figures 3, 4:
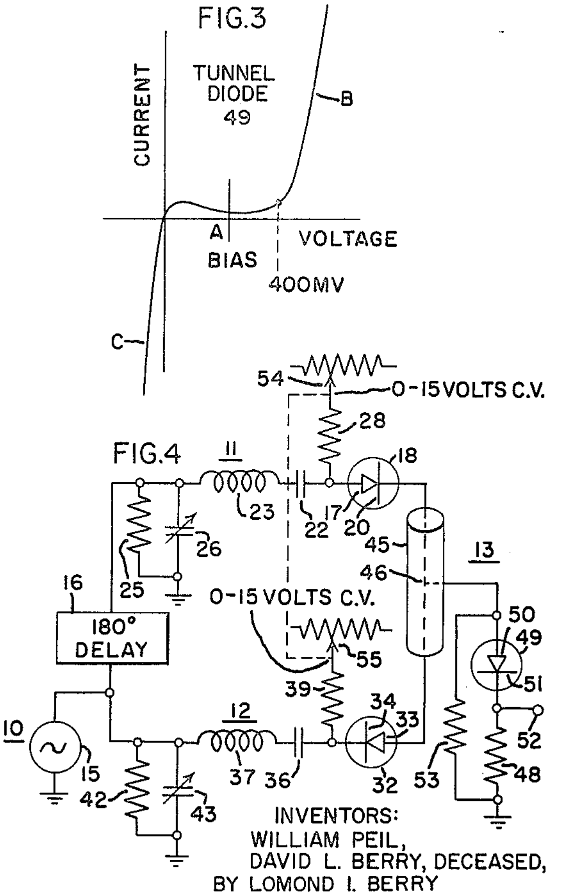
FIG. 3 illustrates the forward and reverse characteristics of the tunnel diode utilized in the low level clipping operation of the circuit of FIG 1.
FIG. 4 is a circuit diagram of another embodiment of the variable width nanosecond pulse generator of the invention utilizing series connected storage diodes.

In the embodiment of FIG. 1, tunnel diode 49 is biased in the center of the valley region (at point A), as shown in FIG. 3, to improve the signal-to-base line noise ratio. Being biased in the center of the valley region, diode 49 presents a high impedance to low level signals, e.g., noise signals, and a low impedance to high level signals, in particular, the wavefronts generated in channels 11 and 12. Upon application of a substantial positive signal from delay line 45 to diode 49, the diode operates in the forward part of its characteristics, indicated at B in FIG. 4, while upon application of a substantial negative signal from delay line 45, diode 49 operates in the back part of its characteristics indicated at C. Thus, diode 49 greatly attenuates the low level signals to improve the signal output at terminal 52. The reason for selection of this type of clipper is the high speed exhibited by back diodes utilizing tunneling phenomena. Other devices, utilizing majority carrier conduction such as vacuum tubes and certain zener diodes of high frequency design may be employed.

A variable width pulse generator has been constructed, in accordance with the embodiment shown in FIG. 1, wherein the pulse width was variable between 0.4 and 3 nanoseconds at a repetition rate of approximately 40–630 megacycles per second. The output pulse amplitude was from 3 to 20 volts, producing several watts of peak power.

The arrangement illustrated in FIG. 1 may have the following circuit values:

| | |
|---|---|
| Sinewave generator (at desired repetition rate) | 10 |
| 470 pf. capacitor | 22 |
| 0.9 micro h. inductor | 23 |
| 50 ohm resistor | 25 |
| 7–45 pf. capacitor | 26 |
| 360 ohm resistor | 28 |
| 470 pf. capacitor | 36 |
| 0.9 micro h. inductor | 37 |
| 360 ohm resistor | 39 |
| 50 ohm resistor | 42 |
| 7–45 pf. capacitor | 43 |
| Snap-off diodes G.E. Type SSD–558 | 18, 32 |
| Back diode (experimental tunnel diode) | 50 |
| 50 ohm resistor | 48 |
| 50 ohm transmission line | 45 |

Another embodiment of the invention is illustrated in FIG. 4. The arrangement in FIG. 4 differs primarily from that of FIG. 1 in its use of snap-off diodes connected in series in the respective channels rather than in shunt. Similar reference numerals denote elements in FIG. 4 identical to those illustrated in FIG. 1. The configuration differs also in the use of an additional resistance 53 connected between the output terminal 46 and ground. The presence of this additional resistance permits one to establish the requisite D.C. potentials across the diodes 18 and 32 required to establish the desired times of snap-off.

The arrangements illustrated above utilizing existing storage diodes are capable of generating pulses having peak powers of as much as 100 watts and average powers of several watts.

The rate at which electronic variation in pulse width may be achieved may be quite high, even to the point of adjusting the pulse within the pulse-to-pulse intervals. One may adjust the pulse width or even the pulse polarity within this interval typically 20 nanoseconds. This arises because the time affecting mechanism depends upon the direct injection of current into the snap-off diode per se rather than upon a parasitic frequency controlling adjunct. The rapidity of response to a change in control voltage is thus due to the natural high frequency ability of the diode.

While the invention has been described in connection with the use of a sinusoidal input waveform, considerable latitude may be utilized in the selection of an input waveform. If a delay network is utilized, as the element 16 in the illustrated embodiments, alternate half-cycles should be symmetrical to insure approximate balance between the outputs of the respective channels. If an arrangement is used where opposing waveforms are synthesized, as by the use of a push-pull drive, there is no requirement that the input waveform be symmetrical. As indicated earlier, the input waveform should have a period greater than the desired output pulse duration and sufficient energy content to excite the snap-off phenomena.

When short duration pulses of the fractional and integral nanosecond variety are being discussed in practical circuit configurations, like those disclosed here, it is apparent that transit times are so substantial, that the effects taking place in various parts of the circuit may be simultaneous, in succession or in reversed succession dependent upon the method of chronology. Since the network synthesizes a pulse at the output terminal, dependent on the relative time of arrival there of two wavefronts traveling on different paths, it is to this point that the measurement of time is referred. (It is of little consequence that a wavefront may have been initiated in channel 1 first, only to arrive at the output terminal after the wavefront initiated in channel 2.) The claims have accordingly used the term "relative" to denote timing with respect to the arrival at the output terminal of the effect of the respective electrical phenomena. Since the input waveform is of a relatively lower frequency, the relative timing problem is less acute in the input portions of the circuit. The effect of non-precise—but approximate—phase opposition is thus mainly to increase the signal-to-noise ratio.

While the illustrated arrangements have shown a single alternating input waveform feeding each channel and cooperating with a controlled current injection to achieve differential snap-off times, one may also use an input waveform consisting of a simultaneously applied pair of oppositely poled unidirectional pulses poled to snap-off the respective didodes in the individual channels. At the same time sufficient current is supplied by the control potentials to provide the required forward injection to achieve snap-off.

While the invention has been disclosed in specific embodiments, it should be apparent that many modifications will be obvious to those skilled in the art. Accordingly, it is intended in the appended claims to claim all such variations as fall within the true spirit and scope of the invention.

What is claimed as new and desired to be secured by Letters Patent of the United States is:

1. A pulse generator comprising:

(a) a source of alternating waves of pre-determined frequency, (b) a first channel having waves applied thereto from said source, said channel including a storage diode having snap-off characteristics connected in said channel to permit transmission of positive currents and to effect a sharp reduction in transmission abruptly, but at a time appreciably after onset of applied negative currents at said pre-determined frequency, to create a first wavefront, (c) a second channel having waves applied thereto from said source of a polarity opposing those applied to said first channel, said second channel having a snap-off storage diode connected to permit transmission of negative currents and to effect a sharp reduction in transmission abruptly, but at a time appreciably after onset of positive currents at said predetermined frequency to create a second wavefront, (d) means coupled to at least one of said channels to time said snap-offs at relatively different instants in time within an interval during which the amplitudes of said waves at said respective diodes are substantial, and (e) common output load means reconnecting said first and second channels to a common output terminal with sufficient mutual isolation to permit the creation of independent wavefronts in the respective channels, said output terminal being so placed with respect to said channels that waves propagating to said output terminal in the respective channels will cancel if said diodes are actuated relatively simultaneously or left unactuated and that a pulse will be synthesized from said separated wavefronts when said diodes are caused to snap off at relatively different times.

2. The arrangement set forth in claim 1 wherein said timing is effected by an offset of the relative phase of the waves applied to the respective diodes.

3. The arrangement set forth in claim 1 wherein said timing is effected by current injection in one of said diodes.

4. The arrangement set forth in claim 1 wherein current is injected in both diodes and adjusted in equal but opposite amounts to control the width of the output pulse while retaining the periodicity of the output pulses unchanged.

5. The arrangement set forth in claim 1 wherein sufficient current is injected in the diode initially snapping off to delay the wavefront initiated therein relatively behind that of the other diode to effect a reversal of output pulse polarity.

6. The arrangement set forth in claim 1 wherein current is injected in each of said diodes and adjusted in equal and opposite amounts of sufficient magnitude to invert the order of initiation of the respective wavefronts and thereby the output pulse polarity while retaining the periodicity of the output pulses unchanged.

7. The arrangement set forth in claim 1 wherein said diodes are series connected in their respective channels.

8. The arrangement set forth in claim 1 wherein said diodes are shunt connected in their respective channels.

9. The arrangement set forth in claim 1 wherein said mutual isolation is provided by introducing a delay in the paths of said output load means interconnecting said channels greater than the interval between snap-offs.

10. The arrangement set forth in claim 1 wherein limiting means are provided coupled to said output means for discriminating against low intensity signals.

11. The arrangement set forth in claim 1 wherein limiting means are provided coupled to said output means for discriminating against low intensity signals comprising a series-connected tunnel diode operated in the backward mode, characterized by a high impedance, low voltage characteristic when biased in the valley region.

12. A pulse generator comprising:

(a) a source of alternating waves of pre-determined frequency, (b) a first channel having waves applied thereto from said source, said channel including a switch for controlling the transmission of waves through said channel, said switch having a switching time less than the duration of an energy pulse of said waves to create a step wavefront of a first polarity, (c) a second channel having waves applied thereto from said source of a polarity opposite to that of the waves applied to said first channel, said second channel including a switch for controlling the transmission of waves through said second channel, said switch having a switching time less than the duration of an energy pulse of said waves to create a step wavefront of opposing polarity;

(d) means coupled to at least one of said channels to adjust the relative timing of said respective switches to occur at spaced moments within an interval during which the amplitudes of said waves at said respective switches are substantial, and (e) common output load means reconnecting said first and second channels to a common output terminal with sufficient mutual isolation to permit the creation of independent wavefronts in the respective channels, said common output terminal being so placed with respect to said channels that waves propagating to said output terminal in the respective channels will cancel if said switches are actuated relatively simultaneously or left unactuated and that a pulse will be synthesized from said separated wavefronts when said switches are actuated at relatively different times.

13. The arrangement set forth in claim 12 wherein said switch is a storage diode.

14. The arrangement set forth in claim 12 wherein said switch is a storage diode having snap-off characteristics.

References Cited by the Examiner

Pub. I: "Tunnel Diode Manual" by General Electric Co., dated Mar. 20, 1961, Figure 6.4 and page 61 relied on.

ARTHUR GAUSS, *Primary Examiner.*

JOHN W. HUCKERT, *Examiner.*